United States Patent
Dadvand et al.

(10) Patent No.: US 10,714,439 B2
(45) Date of Patent: Jul. 14, 2020

(54) ELECTRONIC DEVICE HAVING COBALT COATED ALUMINUM CONTACT PADS

(71) Applicant: TEXAS INSTRUMENTS INCORPORATED, Dallas, TX (US)

(72) Inventors: Nazila Dadvand, Richardson, TX (US); Helmut Rinck, Gammelsdorf (DE)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/107,545

(22) Filed: Aug. 21, 2018

(65) Prior Publication Data

US 2019/0109104 A1 Apr. 11, 2019

Related U.S. Application Data

(60) Provisional application No. 62/568,703, filed on Oct. 5, 2017.

(51) Int. Cl.
| | | |
|---|---|---|
| H01L 23/00 | (2006.01) | |
| H01L 21/56 | (2006.01) | |
| H01L 21/78 | (2006.01) | |

(52) U.S. Cl.
CPC .............. *H01L 24/03* (2013.01); *H01L 21/56* (2013.01); *H01L 21/78* (2013.01); *H01L 24/05* (2013.01); *H01L 24/81* (2013.01); *H01L 24/13* (2013.01); *H01L 24/45* (2013.01); *H01L 24/48* (2013.01); *H01L 24/85* (2013.01); *H01L 2224/0381* (2013.01); *H01L 2224/03823* (2013.01); *H01L 2224/0401* (2013.01); *H01L 2224/04042* (2013.01); *H01L 2224/05073* (2013.01); *H01L 2224/05124* (2013.01); *H01L 2224/05573* (2013.01); *H01L 2224/05624* (2013.01); *H01L 2224/05657* (2013.01); *H01L 2224/13111* (2013.01); *H01L 2224/13139* (2013.01); *H01L 2224/13147* (2013.01); *H01L 2224/45111* (2013.01); *H01L 2224/45139* (2013.01); *H01L 2224/45147* (2013.01); *H01L 2224/45565* (2013.01); *H01L 2224/45664* (2013.01); *H01L 2224/48463* (2013.01)

(58) Field of Classification Search
CPC ........... H01L 24/03; H01L 2224/03823; H01L 2224/05657
See application file for complete search history.

(56) References Cited

U.S. PATENT DOCUMENTS

| | | | | |
|---|---|---|---|---|
| 6,503,343 | B1* | 1/2003 | Tench | ..................... C23C 18/32 148/248 |
| 7,247,951 | B2* | 7/2007 | Ho | ....................... H01L 23/498 257/692 |
| 2005/0067688 | A1* | 3/2005 | Humpston | .......... B81C 1/00293 257/704 |

* cited by examiner

Primary Examiner — Quoc D Hoang
(74) Attorney, Agent, or Firm — Dawn Jos; Charles A. Brill; Frank D. Cimino

(57) ABSTRACT

A system and method for bonding an electrically conductive mechanical interconnector (e.g., a bonding wire, solder, etc.) to an electrical contact (e.g., contact pad, termination on a printed circuit board (PCB), etc.) made from an electrically conductive metal (e.g., aluminum) on an electronic device (e.g., integrated circuit (IC), die, wafer, PCB, etc.) is provided. The electrical contact is chemically coated with a metal (e.g., cobalt) that provides a protective barrier between the mechanical interconnector and the electrical contact. The protective barrier provides a diffusion barrier to inhibit galvanic corrosion (i.e. ion diffusion) between the mechanical interconnector and the electrical contact.

14 Claims, 3 Drawing Sheets

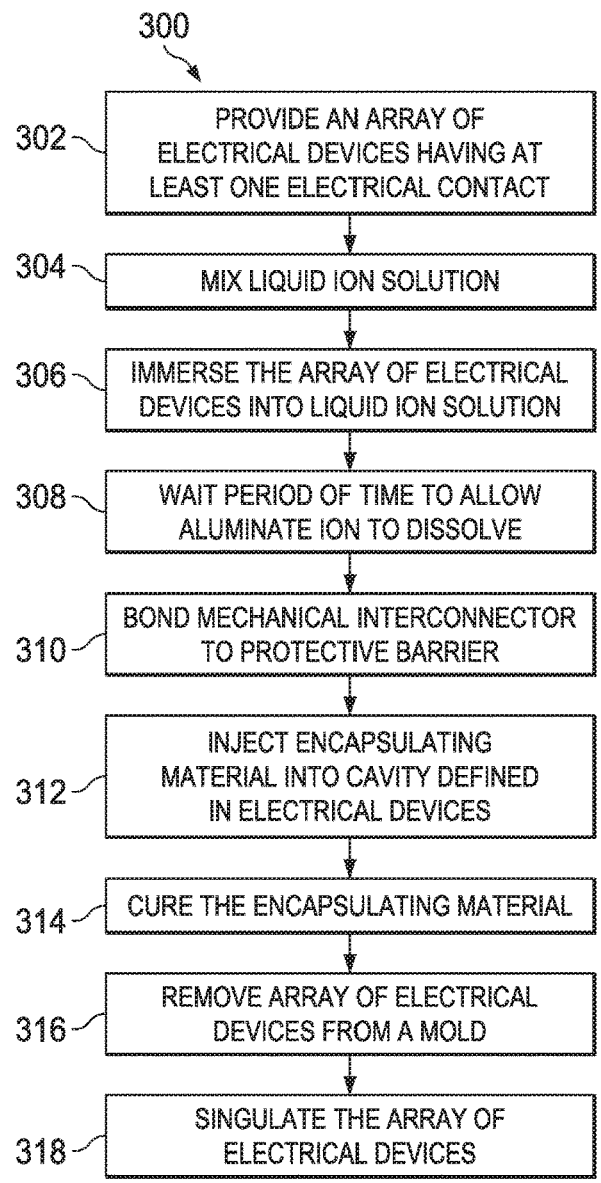
FIG. 3
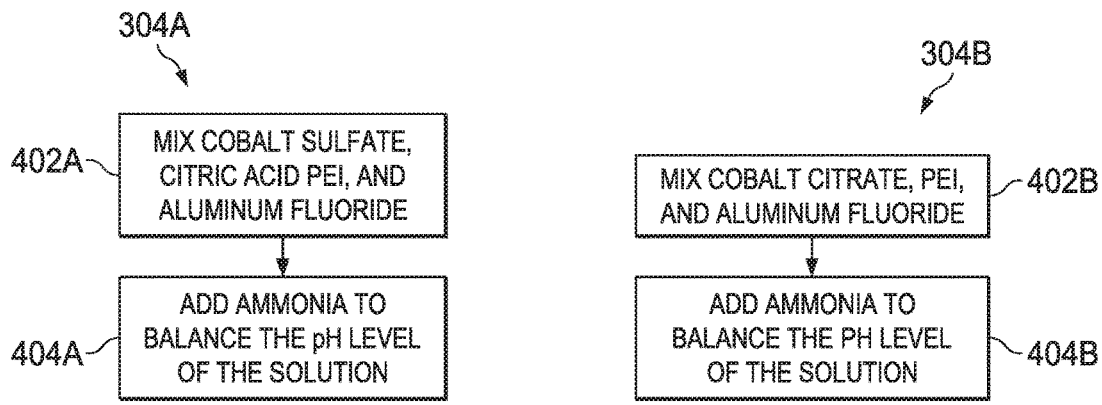
FIG. 4A
FIG. 4B

ELECTRONIC DEVICE HAVING COBALT COATED ALUMINUM CONTACT PADS

RELATED APPLICATIONS

This application claims priority from U.S. Provisional Patent Application Ser. No. 62/568,703, filed 5 Oct. 2017, which is incorporated herein in its entirety.

TECHNICAL FIELD

This relates to an electronic device having chemically coated contact pads.

BACKGROUND

Integrated circuits (IC) require electrically conducting connections to provide an electrically conductive connection between the IC's contact pads to the IC package leads or terminations. This is often achieved with the use of bonding wires. Some examples of bonding wire materials include gold, copper, and aluminum. Gold bonding wire is corrosion resistant, have a homogeneous chemical composition and stable mechanical properties. Gold bonding wire is used in plastic packages because it is faster and easier to use. Copper bonding wire, however, is an alternative to gold bonding wire due to copper's conductivity, material properties, and economical benefit. Copper wire of smaller diameter can achieve the same performance as gold bonding wire of a bigger diameter.

Challenges, however, exist in bonding the copper bonding wire to the aluminum contact pads. Specifically, the formation of a copper-aluminum (Cu—Al) intermetallic compound at a bonding interface between the copper bonding wire (i.e. copper bonding ball) and the aluminum pad has led to failures at the bonding interface. For example, the Cu—Al intermetallic compound has poor mechanical properties (e.g., brittle, easily cracks). In addition, galvanic corrosion (i.e., ion diffusion) occurs at the bonding interface, which deteriorates the electrical and mechanical properties of the compound thereby leading to failures at the bonding interface.

One option to address corrosion is to coat the copper bonding wire with palladium. The distribution of palladium, however, on the interface surface of the copper bonding ball is dependent on electronic flame off (EFO) current during the ball bonding process, which leads to inconsistent distribution results. Thus, a majority of the palladium can form around the neck of the copper bonding ball and not on the interface surface. As a result, the inconsistency of distributing the palladium on the copper bonding ball interface results in a copper-aluminum interface as above, which leads to galvanic corrosion.

The same challenges exist for solder ball applications used on IC's and printed circuit boards (PCB). In some compositions, solder also contains copper along with tin and/or silver. Thus, ion diffusion also occurs between the elements in the solder composition and the aluminum contact, which deteriorates the electrical and mechanical properties of the compound thereby leading to failures at the bonding interface.

SUMMARY

In described examples, a method includes providing an electrical device having an aluminum pad. The electrical device is immersed into a cobalt ion solution to chemically displace an aluminum oxide layer from the aluminum pad and the aluminum oxide layer is oxidized to form an aluminum ion and free electrons. The cobalt ion liquid solution combines with the free electrons to form a cobalt metal and a layer of the cobalt metal is deposited on the aluminum pad in place of the aluminum oxide layer. An electrically conductive mechanical interconnector is bonded to the cobalt metal layer.

In another example, a method includes providing an electrical device having a plurality of aluminum pads and mixing a liquid cobalt ion, polyethylenimine, and aluminum fluoride to form a cobalt ion liquid solution. Ammonia is added to the cobalt ion liquid solution to adjust a pH of the cobalt ion liquid solution to a neutral range. The method further includes immersing the electrical device in the liquid ion solution to chemically displace an aluminum oxide layer from the plurality of aluminum pads and oxidizing the aluminum oxide layer to form an aluminum ion and free electrons. The cobalt ion liquid solution combines with the free electrons to form a cobalt metal and a layer of the cobalt metal is deposited on the plurality of aluminum pads and a mechanical interconnector is bonded to the cobalt metal layer.

In yet another example, an electronic device is disclosed that includes a die and an electrical contact embedded in the die where the electrical contact includes an exposed surface. A protective metal barrier is disposed on the exposed surface of the electrical contact and a mechanical interconnector bonded to the protective metal barrier. The protective metal barrier inhibits ion diffusion between the electrical contact and the mechanical interconnector.

BRIEF DESCRIPTION OF THE DRAWINGS

FIG. 3 illustrates an overall chemical exchange reaction process.

FIG. 4A illustrates mixing an example cobalt ion solution.

FIG. 4B illustrates mixing another example of a cobalt ion solution.

DETAILED DESCRIPTION

Disclosed herein is a system and method for bonding an electrically conductive mechanical interconnector (e.g., a bonding wire, solder, etc.) to an electrical contact (e.g., contact pad, termination on a printed circuit board (PCB), etc.) made from an electrically conductive metal (e.g., aluminum) on an electronic device (e.g., integrated circuit (IC), die, wafer, PCB, etc.). The electronic device may be a part of an array of electrical devices where each of the electrical devices has at least one electrical contact. Prior to attaching the mechanical interconnector to the electrical contact, however, the electrical contact is chemically coated with a metal (e.g., cobalt) that provides a protective barrier between the mechanical interconnector and the electrical contact. The protective barrier provides a diffusion barrier to inhibit galvanic corrosion (i.e. ion diffusion) between the mechanical interconnector and the electrical contact.

Figure 1:
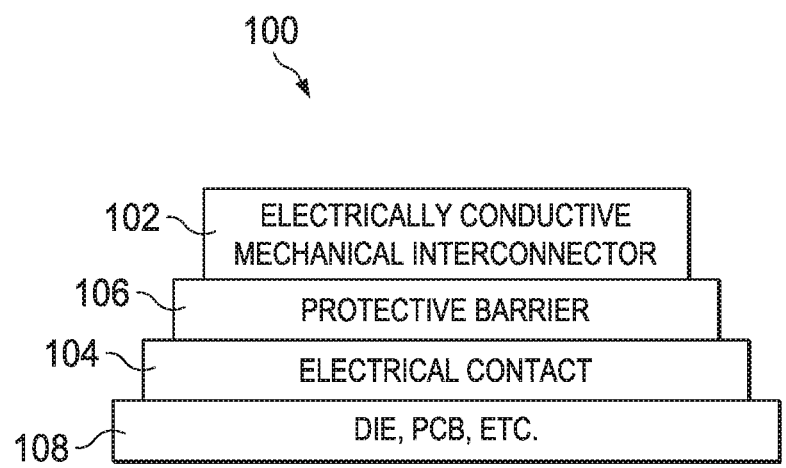
FIG. 1 is a block diagram representation of an electronic device that illustrates a bond between an electrically conductive mechanical interconnector and an electrical contact.

FIG. 1 is a block diagram representation of an electronic device (e.g. integrated circuit (IC)) 100 that illustrates a bond between an electrically conductive mechanical interconnector (e.g., bonding wire, solder, etc.) 102 and an electrical contact (e.g., contact pad, electrical termination, etc.) 104. In one example, the mechanical interconnector 102 can be a bonding wire that provides an electrical connection between the electronic device 100 and the electrical contact 104. In another example, the mechanical interconnector 102 can be solder disposed on the electrical contact 104 of a printed circuit board (PCB).

The electrical contact 104 is partially embedded in a die 108 of the electronic device 100. A protective barrier 106 is provided between the mechanical interconnector 102 and the electrical contact 104. In one example, the electrical contact 104 can be a contact (e.g., aluminum contact/pad) as part of a die arranged in an integrated circuit (IC) in bonding wire applications where the bonding wire is the electrically conductive mechanical interconnector 102. In another example, the electrical contact 104 can be an electrical termination formed on a printed circuit board (PCB) in solder applications where the solder is the electrically conductive mechanical interconnector 102.

The protective barrier 106 is a metal layer (e.g., cobalt) that is chemically applied, via a chemical exchange reaction, to the electrical contact 104. The protective barrier 106 is a diffusion barrier that inhibits galvanic corrosion (i.e. ion diffusion) between the mechanical interconnector 102 and the electrical contact 104.

For simplicity, the system and method disclosed herein will be described in relation to wire bonding applications. The system and method, however, can be used in solder (e.g., solder ball) interconnector applications, as well as other mechanical interconnector-electrical contact applications. More specifically, the system and method disclosed herein will be described in which the mechanical interconnector 102 is copper bonding wire and the electrical contact 104 is an aluminum contact pad in an IC. Thus, the protective barrier 106 provides a diffusion barrier to inhibit galvanic corrosion (i.e. ion diffusion) between the copper bonding wire and the aluminum contact pad.

In addition to the economic advantages of using copper bonding wires over gold bonding wires, copper bonding wires have a high purity Cu matrix and exhibit significantly better conductivity than gold. As a result, better heat dissipation and increased power ratings are attainable with thinner wire diameters. In addition, copper has better mechanical properties than gold and thus has excellent ball neck strength and high loop stability during molding or encapsulation. Thus, the use of copper bonding wires over gold bonding wires facilitates the development of smaller device packages at reduced costs while improving performance and reliability.

Figure 2A:
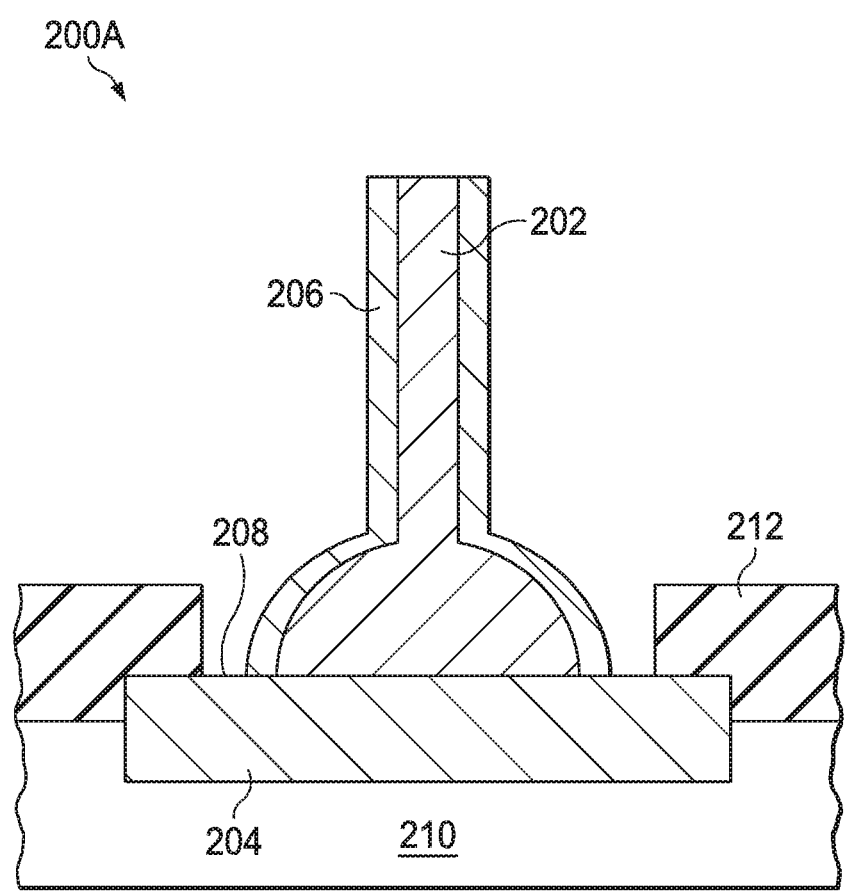
FIGS. 2A and 2B are partial views illustrating a bonding wire connector with no protective barrier and a bonding wire connector with a protective barrier respectively.
Figure 2B:
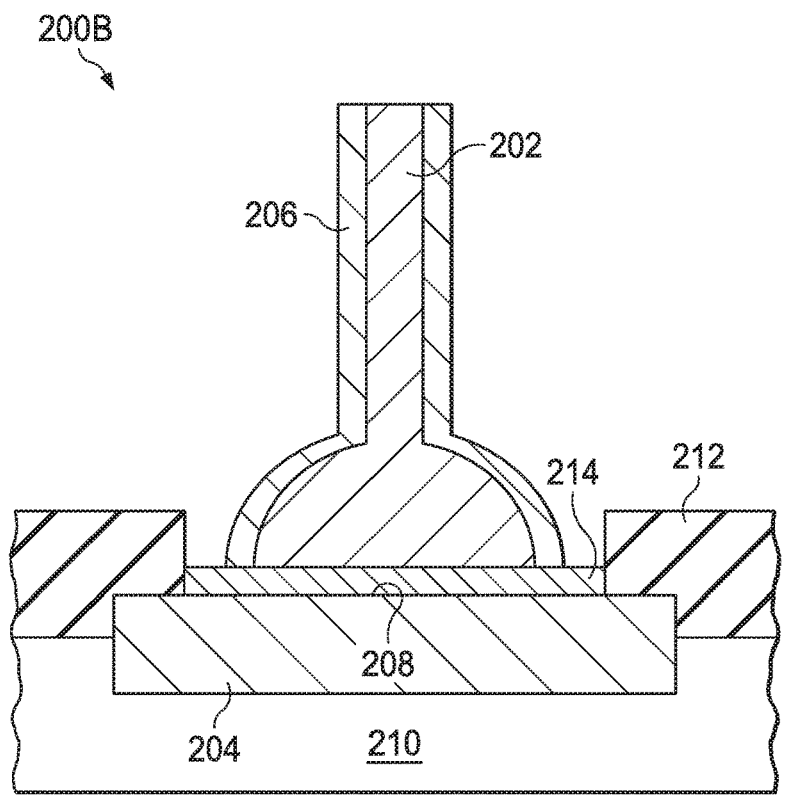

FIGS. 2A and 2B, are partial views of an electrical device illustrating a bonding wire connector with no protective barrier 200A and a bonding wire connector with a protective barrier (e.g., cobalt) 200B respectively. An electrically conductive mechanical interconnector copper bonding wire) 202 is bonded to an electrical contact (e.g., aluminum contact pad) 204. In one example, the mechanical interconnector 202 is not coated with another metal. In another example, illustrated in FIGS. 2A and 2B, the mechanical interconnector 202 can be coated with another metal (e.g., palladium) 206. In the example of FIGS. 2A and 2B, the electrical contact 204 can be partially embedded in a wafer or die 210 such that only a contact surface (or a portion thereof) 208 of the electrical contact 204 is exposed. At least one dielectric material layer 212 can be disposed on the wafer or die 210.

Referring to FIG. 2B, a protective layer (e.g., barrier) 214 is disposed on the contact surface 208 of the electrical contact 204. The protective layer 214 is chemically disposed on the contact surface 208 of the electrical contact 204 via a chemical exchange reaction, as will be described further below. The protective layer 214 can be comprised of a metal (e.g., cobalt) that inhibits ion diffusion between the mechanical interconnector 202 and the electrical contact 204. The protective layer 214 also enhances the electrical and mechanical properties between the mechanical interconnector 202 and the electrical contact 204.

Figure 5:
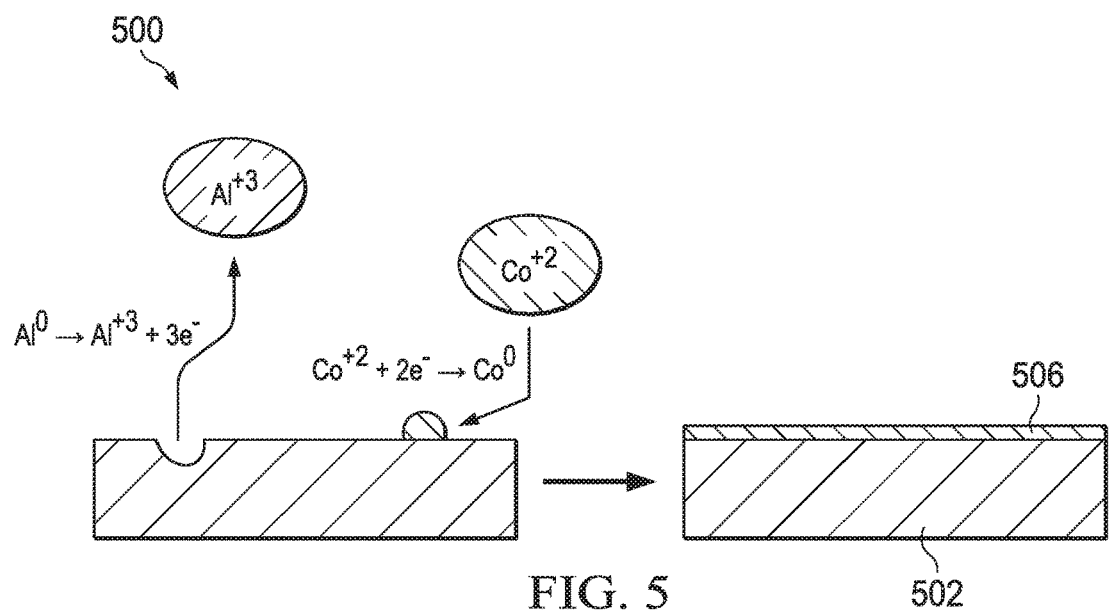
FIG. 5 is an example process that annotatively illustrates creating and depositing the protective barrier on the electrical contact.

Referring to FIGS. 3-5, FIGS. 3, 4A, and 4B are flow diagrams that illustrate the process of bonding an electrically conductive mechanical interconnector to an electrical contact with a protective barrier disposed between the two to inhibit ion diffusion. Specifically, FIG. 3 illustrates the overall chemical exchange reaction process 300 and packaging process, FIG. 4A illustrates one example of mixing a cobalt ion solution, and FIG. 4B illustrates another example of mixing a cobalt ion solution. FIG. 5 is an example process 500 that annotatively illustrates creating and depositing of the protective barrier formed of cobalt on the electrical contact formed of aluminum. The chemical reaction is an exchange reaction that removes a layer of the electrical contact 204 and replaces it with a layer of the protective layer 214. More specifically, the chemical exchange reaction removes and dissolves a thin layer (e.g., less than 1 micron) of the electrical contact 204 and chemically adds a thin layer (e.g., less than or equal to 2 microns) of the protective layer 214 to the electrical contact 204. In one example, the removal of the thin layer of the electrical contact 204 is approximately 0.5 microns.

The chemical exchange reaction process 300 begins at 302, where an array of electrical devices where each of the electrical devices have at least one electrical contact (e.g., aluminum pad) 204 as disclosed herein is provided. At 304, a liquid ion solution (e.g., cobalt ion solution) is mixed. In one example 304A illustrated in FIG. 4A, at 402A, the liquid ion solution can be comprised of several liquid ingredients including a liquid that provides a source of cobalt ions, such as cobalt sulfate, a first complexing agent such as a citric acid (e.g., sodium citrate), a grain refiner (e.g., polyethylenimine (PEI)) that reduces a size of the grain of the protective layer 214, a second complexing agent such as fluoride. The concentrations of each ingredient are based on the amount of the liquid ion solution required to carry out the chemical exchange reaction and material of the electrical contact 204. For example, a liter of the liquid ion solution and an electrical contact 204 made from aluminum can require approximately 20-40 grams/liter (g/l) of cobalt sulfate or cobalt citrate, approximately 50-140 g/l of the first complexing agent (e.g., sodium citrate), approximately 0.1-2 g/l of PEI, and approximately 1-20 g/l of aluminum fluoride. In one example, the liquid ion solution can include approximately 30 g/l of the cobalt sulfate, approximately 75 g/l of the sodium citrate, approximately 1 g/l of the PEI, and approximately 5 g/l of the aluminum fluoride. The first complexing agent controls the displacement reaction rate of the displacement chemical reaction. The first complexing agent also stabilizes the cobalt ions in the solution to prevent the precipitation of cobalt hydroxide, which allows the cobalt solution to achieve a weak acidity without precipitation of cobalt hydroxide. At 404A, an appropriate amount of ammonia is added to the liquid ion solution to adjust or balance the pH level to a neutral range of approximately 6-7. Without the ammonia to balance the pH, the liquid ion solution will become to alkali or acidic and the aluminum will simply dissolve when it is immersed in the liquid ion solution.

In another example 304B illustrated in FIG. 4B, at 402B, the liquid ion solution can be comprised of several liquid ingredients including a liquid that provides a source of cobalt ions such as cobalt citrate, a grain refiner (e.g., polyethylenimine (PEI)) that reduces a size of the grain of the protective layer 214, a complexing agent such as fluoride. The concentrations of each ingredient are based on the amount of the liquid ion solution required to carry out the chemical exchange reaction and material of the electrical contact 204. For example, a liter of the liquid ion solution and an electrical contact 204 made from aluminum can require approximately 20-40 grams/liter (g/l) of cobalt citrate, approximately 0.1-2 g/l of PEI, and approximately 1-20 g/l of aluminum fluoride. In one example, the liquid ion solution can include approximately 30 g/l of the cobalt citrate, approximately 1 g/l of the PEI, and approximately 5 g/l of the aluminum fluoride. At 404A, an appropriate amount of ammonia is added to the liquid ion solution to adjust or balance the pH level to a neutral range of approximately 6-7. As above, without the ammonia to balance the pH, the liquid ion solution will become to alkali or acidic and the aluminum will simply dissolve when it is immersed in the liquid ion solution.

Referring back to FIG. 3, at 306, the array of electrical devices is immersed in the liquid ion solution. As a result of immersing the array of electrical devices into the liquid ion solution, a displacement (first) chemical reaction takes place or is formed in the liquid ion solution whereupon a layer of the electrical contact 204 is removed or displaced by the chemical reaction. The layer of the electrical contact 204 oxidizes and releases or displaces electrons to form an ion and free electrons. The ion combines with a second complexing agent to form a salt that eventually dissolves in the liquid ion solution. The free electrons combine with the liquid ion solution (e.g., cobalt ions) to from the protective metal barrier, as described further below in a replacement chemical reaction.

For example, in the example of the aluminum contact pad illustrated in FIG. 5, the aluminum pad 502 has a stable layer of aluminum oxide on its surface due to oxidation. The aluminum oxide layer is removed during the immersion of the aluminum pad into the liquid ion solution due to the acidity of the liquid ion solution. Specifically, the acidity of the liquid ion solution dissolves out the aluminum oxide layer, which results in a fresh exposed surface of aluminum that is available cobalt ions for the occurrence of the replacement reaction.

In the aluminum contact pad example, the displacement reaction takes place according to Equation 1.

$$Al^0 \rightarrow Al^{+3} + 3e^- \tag{1}$$

The layer of aluminum oxidizes and releases three electrons to form an aluminum ion $Al^{+3}$ and three free electrons $3e^-$ as illustrated in Equation 1. A second complexing agent (e.g., fluoride) for the aluminum ions $Al^{+3}$ provides a source of fluoride ions that facilitate the displacement reaction between Al and $Co^{+2}$ due to the high affinity of $F^-$ ions in the complexing agent with the aluminum ions $Al^{+3}$. An aluminate ion, $Al(OH)_4^-$, is then formed from the aluminum and is dissolved in the liquid ion solution.

Still referring to FIG. 5 a replacement (second) chemical reaction takes place or is formed in the liquid ion solution. The second chemical reaction combines the free electrons displaced from the electrical contact 204 (e.g., electrons from the aluminum contact pad) with the liquid ion solution to chemically transform the liquid ion solution into a liquid metal (e.g., cobalt) thereby forming the protective barrier. In the aluminum contact pad example, two of the three free electrons are captured by the cobalt ion to form the cobalt metal, as illustrated in FIG. 5 and in Equation 2.

$$Co^{+2} + 2e^- \rightarrow Co^0 \tag{2}$$

The overall chemical exchange reaction is illustrated in Equation 3.

$$2Al^0 + 3Co^{+2} \rightarrow 2Al^{+3} + 3Co^0 \tag{3}$$

Again, as a result of immersing the array of electrical devices into the liquid ion solution, a layer of the liquid metal (e.g., cobalt, 506 of FIG. 5) is deposited on the electrical contact 204 (502 of FIG. 5) to replace the removed layer. During deposition of the cobalt, the cobalt selectively reacts with only the aluminum pad. In other words, the cobalt will not deposit on any other metal or material on the IC. The cobalt will only deposit on the aluminum pad. In addition, the cobalt will deposit on all exposed portions of the aluminum pad thereby protecting the aluminum pad from outside elements.

The chemical exchange reaction is a self-limiting reaction. In other words, the reaction will stop when all of the aluminate ion is consumed (dissolves). The reaction time, however, can be shortened by heating the liquid ion solution. For example, the reaction time at room temperature is approximately 30 minutes. If the solution is heated to a temperature of approximately 50° C., the reaction time will decrease by approximately half. Thus, based on the temperature of the liquid ion solution, at 308, the electrical device remains immersed in the liquid ion solution for a period of time to allow the aluminate ion to form and dissolve in the liquid ion solution. The electrical device is then removed from the liquid ion solution. At 310, the mechanical interconnector (e.g., copper bonding wire, solder, etc.) 202 is bonded to the electrical contact 204. At 312, an encapsulating material is injected into a cavity defined in each of the electrical devices. At 314, the encapsulating material is cured. At 316, the array of electrical devices is removed from a mold. At 318, the electrical devices are singulated by sawing or by another cutting process.

For purposes of simplification of explanation, the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A method, comprising:
    forming cobalt ion liquid solution by mixing cobalt citrate, polyethylenimine, and aluminum fluoride, or by mixing cobalt sulfate, citric acid, polyethylenimine, and aluminum fluoride;
    exposing an aluminum pad of each of an array of electrical devices to the cobalt ion liquid solution to chemically displace an aluminum oxide layer from each aluminum pad, wherein the aluminum oxide layer is oxidized to form an aluminum ion and free electrons, wherein the cobalt ion liquid solution combines with the free electrons to form a cobalt metal, and wherein a layer of the cobalt metal is deposited on each aluminum pad in place of the aluminum oxide layer; and
    bonding an electrically conductive mechanical interconnector to the layer of cobalt metal.

2. The method of claim 1, wherein bonding the electrically conductive mechanical interconnector includes bonding a copper bonding wire to the layer of cobalt metal.

3. The method of claim 1, wherein bonding the electrically conductive mechanical interconnector includes disposing a solder ball comprised at least one of copper, tin, and silver on the layer of cobalt metal.

4. The method of claim 1, further comprising adding ammonia to the cobalt ion liquid solution to adjust a pH of the cobalt ion liquid solution to a neutral range.

5. The method of claim 1, wherein prior to bonding the electrically conductive mechanical interconnector to the layer of cobalt metal, the method further comprising waiting a period of time based on a temperature of the cobalt ion liquid solution to allow the aluminum ion to combine with a complexing agent to form a salt solution and for the salt solution to dissolve in the liquid ion solution.

6. The method of claim 1, further comprising:
    injecting an encapsulating material into a cavity defined in each of the electrical devices;
    curing the encapsulating material;
    removing the array of electrical devices from a mold; and
    singulating the array of electrical devices into individual electrical devices.

7. A method, comprising:
    providing an array electrical devices, each of the electrical devices having at least one aluminum pad;
    mixing a liquid cobalt ion solution, polyethylenimine, and aluminum fluoride to form a cobalt ion liquid solution;
    adding ammonia to the cobalt ion liquid solution to adjust a pH of the cobalt ion liquid solution to a neutral range;
    exposing the aluminum pad of each of the array of electrical devices to the cobalt ion liquid solution to chemically displace an aluminum oxide layer from the at least one aluminum pad, the aluminum oxide layer oxidizing to form an aluminum ion and free electrons, wherein the cobalt ion liquid solution combines with the free electrons to form a cobalt metal, and wherein a layer of the cobalt metal is deposited on the at least one aluminum pad; and
    bonding a mechanical interconnector to the layer of cobalt metal.

8. The method of claim 7, wherein mixing the liquid cobalt ion solution includes mixing cobalt citrate with the polyethylenimine and the aluminum fluoride to form the cobalt ion liquid solution.

9. The method of claim 7, wherein mixing the liquid cobalt ion solution includes mixing cobalt sulfate and sodium citrate with the polyethylenimine and the aluminum fluoride to form the cobalt ion liquid solution.

10. The method of claim 9, wherein the liquid cobalt ion solution includes approximately 20-40 g/l of the cobalt sulfate, approximately 50-140 g/l of the sodium citrate, approximately 0.1-2 g/l of the polyethylenimine, and approximately 1-20 g/l of the aluminum fluoride.

11. The method of claim 7, wherein bonding the mechanical interconnector includes bonding a copper bonding wire to the layer of cobalt metal.

12. The method of claim 7, wherein bonding the mechanical interconnector includes disposing a solder ball comprised at least one of copper, tin, and silver on the layer of cobalt metal.

13. The method of claim 7, wherein prior to bonding the electrically conductive mechanical interconnector to the layer of cobalt metal, the method further comprising waiting a period of time based on a temperature of the liquid cobalt ion solution to allow the aluminum ion to combine with a complexing agent to form an aluminate ion solution and for the aluminate ion solution to dissolve in the liquid cobalt ion solution.

14. The method of claim 7, further comprising:
    injecting an encapsulating material into a cavity defined in each of the electrical devices;
    curing the encapsulating material;
    removing the array of electrical devices from a mold; and
    singulating the array of electrical devices into individual electrical devices.

* * * * *